United States Patent
Hwang et al.

(10) Patent No.: US 7,335,974 B2
(45) Date of Patent: Feb. 26, 2008

(54) MULTI STACK PACKAGING CHIP AND METHOD OF MANUFACTURING THE SAME

(75) Inventors: Jun-sik Hwang, Yongin-si (KR);
Woon-bae Kim, Suwon-si (KR);
Chang-youl Moon, Suwon-si (KR);
Moon-chul Lee, Yongin-si (KR);
Kyu-dong Jung, Suwon-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 0 days.

(21) Appl. No.: 11/391,211

(22) Filed: Mar. 29, 2006

(65) Prior Publication Data

US 2006/0255443 A1    Nov. 16, 2006

(30) Foreign Application Priority Data

May 10, 2005    (KR) .................... 10-2005-0038950

(51) Int. Cl.
*H01L 23/02*    (2006.01)
*H01L 21/00*    (2006.01)

(52) U.S. Cl. .................. 257/686; 257/685; 257/723; 257/777; 257/E25.006; 257/E25.013; 257/E25.018; 257/E25.021; 257/E25.027; 257/E23.085; 257/E21.614; 438/109

(58) Field of Classification Search ............... 257/660, 257/686, 723, E23.141, E23.142, 685, 777, 257/E25.006, E25.013, E25.018, E25.021, 257/E25.027, E23.085, E21.614; 438/106, 438/107, 108, 109, FOR. 426
See application file for complete search history.

(56) References Cited

U.S. PATENT DOCUMENTS

| | | | | |
|---|---|---|---|---|
| 5,404,581 | A * | 4/1995 | Honjo | 455/90.1 |
| 6,093,029 | A * | 7/2000 | Kwon et al. | 439/69 |
| 6,313,522 | B1 * | 11/2001 | Akram et al. | 257/686 |
| 6,531,337 | B1 * | 3/2003 | Akram et al. | 438/108 |
| 6,724,019 | B2 * | 4/2004 | Oda et al. | 257/195 |
| 7,088,983 | B2 * | 8/2006 | Hikita et al. | 455/333 |
| 2003/0017722 | A1 * | 1/2003 | Emrick | 438/800 |
| 2003/0205722 | A1 * | 11/2003 | Washio et al. | 257/197 |
| 2004/0129982 | A1 * | 7/2004 | Oda et al. | 257/369 |
| 2005/0184377 | A1 * | 8/2005 | Takeuchi et al. | 257/686 |
| 2006/0102942 | A1 * | 5/2006 | Takahashi | 257/295 |
| 2006/0180840 | A1 * | 8/2006 | Nishimuta et al. | 257/296 |

* cited by examiner

*Primary Examiner*—Jasmine Clark
(74) *Attorney, Agent, or Firm*—Sughrue Mion, PLLC

(57) ABSTRACT

A multi stack packaging chip and a method of manufacturing the chip are provided. The method includes forming at least one second circuit element on a first wafer; forming a second wafer having a cavity and a one third circuit element formed opposite to the cavity; forming a solder on the second wafer; and combining the second wafer with the first wafer so that the second circuit element and the cavity correspond. The chip includes a flip-chip packaged chip in which a first circuit element is packaged using a first wafer; a second circuit element formed on the first wafer; a second wafer having a cavity and combined with the first wafer so that the cavity and the second circuit element correspond; a third circuit element formed on the second wafer; and a solder formed on the second wafer, the solder electrically coupling the second wafer to a packaging substrate.

16 Claims, 12 Drawing Sheets

US 7,335,974 B2

MULTI STACK PACKAGING CHIP AND METHOD OF MANUFACTURING THE SAME

CROSS-REFERENCE TO RELATED APPLICATIONS

This application claims benefit from Korean Patent Application No. 2005-38950 filed on May 10, 2005 in the Korean Intellectual Property Office, the entire disclosure of which is incorporated herein by reference.

BACKGROUND OF THE INVENTION

1. Field of the Invention

The present invention relates to a multi stack packaging chip and a method of manufacturing the same, and more particularly, to a multi stack packaging chip generated by forming and packaging a circuit element on a cap wafer of a flip-chip packaged chip and a method of manufacturing the same.

2. Description of the Related Art

In general, elements performing specific functions like microstructures such as integrated chips (ICs), hybrid chips, radio frequency (RF) systems, or micro electro-mechanical systems (MEMSs) and actuators are easily broken by foreign materials or outer impacts. Thus, circuit elements must be packaged to be prevented from being broken by foreign materials or outer impacts and to be electrically connected to electronic parts, so as to have physical functions and shapes. To achieve such packaging, a packaging substrate is manufactured using an additional substrate, and then a base substrate on which a circuit element is mounted is bonded to the packaging substrate.

FIG. 1 is a cross-sectional view illustrating a conventional packaging of a wafer level. Using wire bonding and is disclosed in U.S. Pat. No. 6,376,280. For the conventional packaging, a viahole is formed in a predetermined area of a cap wafer 24, and a circuit element 14 performing a specific function is formed on a base wafer 12. A bonding pad 18 is formed so as to be electrically connected to the circuit element 14, and a pad 20 is bonded to the cap wafer 24 so as to seal the circuit element 14. Also, gaskets 22 are formed on the cap wafer 24 so as to be bonded to the pad 20, and gaskets 36 are formed so as to be bonded to the bonding pad 18.

Wire bonding is performed via the viahole to connect the circuit element 14 to an external power source. The circuit element 14 is electrically connected to the external power source via wires 30 and the bonding pad 18. However, the wire bonding deteriorates a performance of a chip due to an increase in a parasitic capacitance of the wires 30.

In the wire bonding method, the bonding pad 18 for electrically connecting the circuit element 14 to the external power source must be formed around the circuit element 14. Thus, a size of the chip is increased by a size of the bonding pad 18.

In a case where the chip is packaged using the wire bonding method, another wafer cannot be formed on the cap wafer 24 due to the wires 30. Thus, the chip may not be manufactured in a stack structure.

SUMMARY OF THE INVENTION

An aspect of the present general inventive concept is to provide a multi stack packaging chip generated by forming and packaging a circuit element on a cap wafer of a flip-chip packaged chip and a method of manufacturing the same.

According to an aspect of the present invention, there is provided a multi stack packaging chip including a flip-chip packaged chip in which at least one first circuit element is packaged using a first cap wafer; at least one second circuit element formed on the first cap wafer; a second cap wafer including an area including a cavity and combined with the first cap wafer so that a position of the cavity corresponds to an area in which the second circuit element is positioned; at least one third circuit element formed on the second cap wafer; and a solder formed on the second cap wafer at a distance from the third circuit element and electrically coupling the second cap wafer to a packaging substrate.

The multi stack packaging chip may further include an insulating layer which is formed on the third circuit element so as to insulate the third circuit element from the packaging substrate.

The insulating layer comprises first and second insulating layers, the second insulating layer being formed on the first insulating layer, wherein the first insulating layer comprises a first at least one etched area in which a connecting layer is formed to connect the third circuit element and the solder, and a second at least one etched area through which the third circuit element is exposed, and wherein the second insulating layer comprises a third at least one etched area in which the solder is positioned.

The flip-chip packaged chip may include a base wafer; the at least one first circuit element formed on the base wafer; the first cap wafer including an area including a cavity and combined with the base wafer so that a position of the cavity corresponds to a position of the first circuit element; and a through electrode formed in an area of the first cap wafer in which the cavity is formed, so as to electrically couple the first cap wafer to the first circuit element.

The at least one first circuit element may be two filters, the second circuit element may be a switch, and the third circuit element may be a phase shifter isolating the two filters from each other. Here, the first, second, and third circuit elements may operate as duplexers.

The second cap wafer may include a through electrode formed in the area in which the cavity is formed so as to electrically couple the second cap wafer to the second circuit element.

The third circuit element does not need to be sealed and may be at least one of an inductor, a capacitor, a transistor, and a resistor.

According to another aspect of the present invention, there is provided a method of manufacturing a multi stack packaging chip, the method including forming at least one second circuit element on a first cap wafer of a flip-chip packaged chip in which at least one first circuit element performing a specific function is packaged using the first cap wafer; forming a second cap wafer including an area including a cavity and at least one third circuit element formed on an opposite surface to a surface on which the cavity is formed; forming a solder on the second cap wafer at a distance from the third circuit element, the solder electrically coupling the second cap wafer to a packaging substrate; and combining the second cap wafer with the first cap wafer so that a position of the second circuit element of the first cap wafer corresponds to a position of the cavity of the second cap wafer.

The method may further include forming an insulating layer on the second cap wafer and the third circuit element so as to electrically couple the third circuit element to the packaging substrate.

The forming of the flip-chip packaged chip may include forming the at least one first circuit element on a base wafer;

forming the first cap wafer including an area including a cavity and combined with the base wafer so that a position of the cavity corresponds to a position of the first circuit element; and forming a through electrode in the area of the first cap wafer in which the cavity is formed, so as to electrically couple the first cap wafer to the first circuit element.

The forming of the second cap wafer may include forming a through electrode in the predetermined area of the second cap wafer in which the cavity is formed, so as to electrically connect the second cap wafer to the second circuit element.

The third circuit element does not need to be sealed and may be at least one of an inductor, a capacitor, a transistor, and a resistor.

BRIEF DESCRIPTION OF THE DRAWINGS

The above and other aspects of the present invention will be more apparent by describing certain exemplary embodiments of the present invention with reference to the accompanying drawings, in which.

DETAILED DESCRIPTION OF EXEMPLARY EMBODIMENTS OF THE INVENTION

Figure 1:
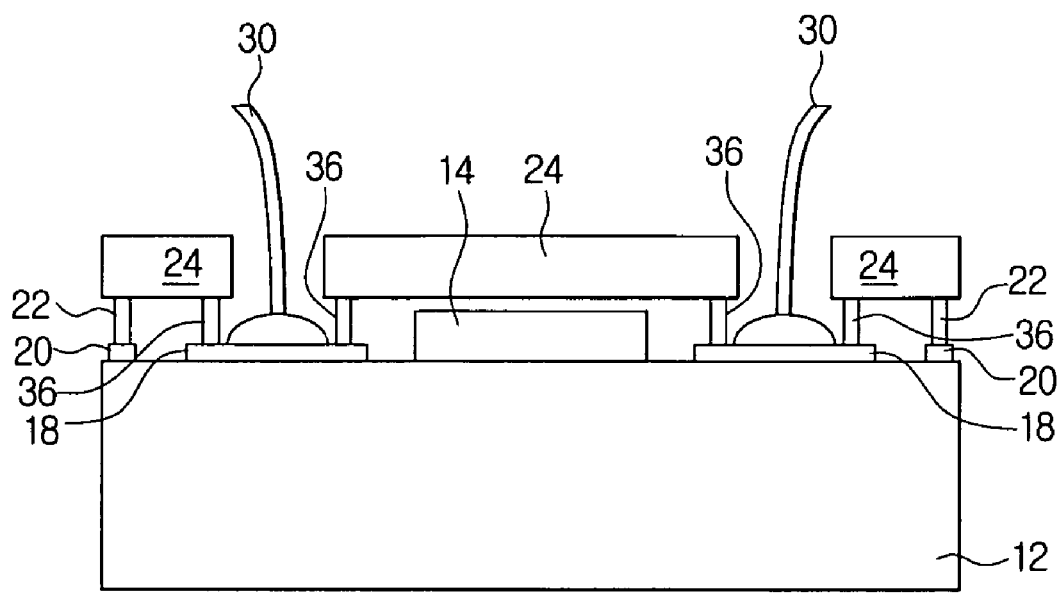
FIG. 1 is a cross-sectional view illustrating a conventional packaging of a wafer level.

Certain exemplary embodiments of the present invention will now be described in greater detail with reference to the accompanying drawings.

In the following description, same drawing reference numerals are used for the same elements even in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

Figure 2:
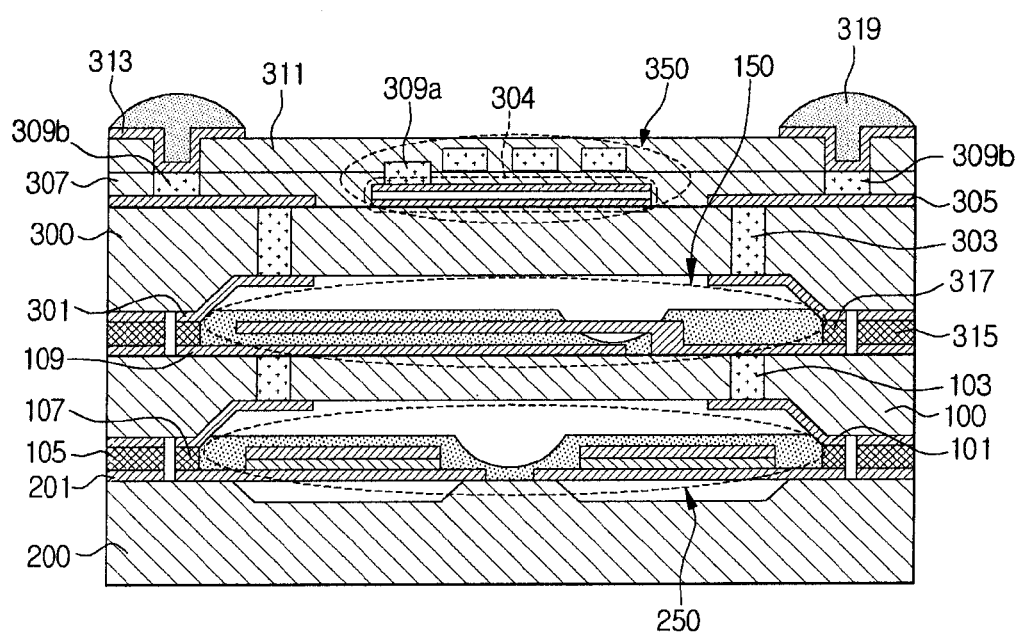
FIG. 2 is a cross-sectional view of a multi stack packaging chip according to an exemplary embodiment of the present invention.

FIG. 2 is a cross-sectional view of a multi stack packaging chip according to an exemplary embodiment of the present invention. Referring to FIG. 2, the multi stack packaging chip includes a base wafer 200, at least one first circuit element 250 formed on the base wafer 200, a first cap wafer 100 packaging the first circuit elements 250, a second circuit element 150 formed on the first cap wafer 100, a second cap wafer 300 packaging the second circuit element 150, at least one third circuit element 350 formed on the second cap wafer 300, an insulating layer 311 formed on the third circuit element 350, and a solder 319 formed in an etched area of the insulating layer 311 so as to electrically connect the second cap wafer 300 to a packaging substrate (not shown). The etched area of the insulating layer 311 may be predetermined.

The first circuit elements 250 performing specific functions are positioned on the base wafer 200. A bonding pad 201 is positioned in an area of the base wafer 200 so as to be combined with the first cap wafer 100 packaging the first circuit elements 250. The area may be predetermined.

A cavity is formed in a area of a surface of the first cap wafer 100, and the first cap wafer 100 is combined with the base wafer 200. A first through electrode 103 is positioned in an area of the cavity of the first cap wafer 100 so as to electrically connect the first cap wafer 100 to the first circuit elements 250.

A first lower electrode 101 is formed underneath the first through electrode 103, and a first contact pad 107 is formed underneath the first lower electrode 101. The first contact pad 107 is connected to the first circuit elements 250 positioned on the base wafer 200, and a first sealing pad 105 of the first cap wafer 100 is combined with the bonding pad 201 of the base wafer 200.

The second circuit element 150 to be packaged is positioned on the first cap wafer 100, and the second cap wafer 300 is combined with the first cap wafer 100 to package the second circuit element 150. Here, a first upper electrode 109 is formed in an area of an upper surface of the first cap wafer 100 including the first through electrode 103. The area may be predetermined. The second circuit element 150 is positioned on the first upper electrode 109. Thus, the first and second circuit elements 250 and 150 are electrically connected to each other through the first upper electrode 109, the first through electrode 103, the first lower electrode 101, and the first contact pad 107.

Here, the second cap wafer 300 has the same structure as the first cap wafer 100. In other words, a cavity is formed in an area of the second cap wafer 300, and a second through electrode 303 is positioned in an area of the cavity so that the second circuit element 150 is electrically connected to the second cap wafer 300 through the second through electrode 303. The area may be predetermined. Also, a second lower electrode 301 is formed underneath the second through electrode 303, and a second contact pad 317 is formed underneath the second lower electrode 301. Here, the second lower electrode 301 operates as a lead wire electrically connecting the second circuit element 150 to the second through electrode 303. A second sealing pad 315 is positioned in an area of the first cap wafer 100 in which a cavity is not formed so as to keep a distance from the second contact pad 317 and combines the second cap wafer 300 with the first cap wafer 100. The distance may be predetermined.

A second upper electrode 305 is positioned on the second cap wafer 300, and a third circuit element 350 is positioned on the second upper electrode 305. Thus, the third and second circuit elements 350 and 150 are electrically connected to each other through the second upper electrode 305, the second through electrode 303, the second lower electrode 301, and the second contact pad 317.

First and second insulating layers 307 and 311 are formed on the third circuit element 350 so as to insulate the third circuit element 350 from a packaging substrate (not shown). Also, an area of the second insulating layer 311 is etched to be peeled so that a solder 319 electrically connected to a packaging substrate (not shown) is positioned in the etched area. Here, the second cap wafer 300 is not combined with another wafer. The area may be predetermined. Thus, the third circuit element 350 does not require sealing packaging and thus may be an inductor, a capacitor, a resistor, a transistor, or other component known in the art.

Alternatively, an additional cap wafer and the second cap wafer 300 may be combined with each other to package the third circuit element 350 positioned on the second cap wafer 300, and then a fourth circuit element may be formed on the additional cap wafer. In other words, as the second circuit element 150 is positioned on the first cap wafer 100 and then packaged using the second cap wafer 300, the third circuit element 350 may be positioned on the second cap wafer 300 and then packaged using a cap wafer so as to package a plurality of circuit elements in a stack structure.

The multi stack packaging chip shown in FIG. 2 is used for packaging in a structure including a microstructure chip such as a communication hybrid chip, an RF MEMS filter, a duplexer, a switch, an MEMS actuator, or other similar component known in the art. In a case where the first circuit elements 250 are two filters, the second circuit element 150 is a switch, and the third circuit element 350 is a phase shifter, the multi stack packaging chip may be used as a duplexer.

Figure 3:
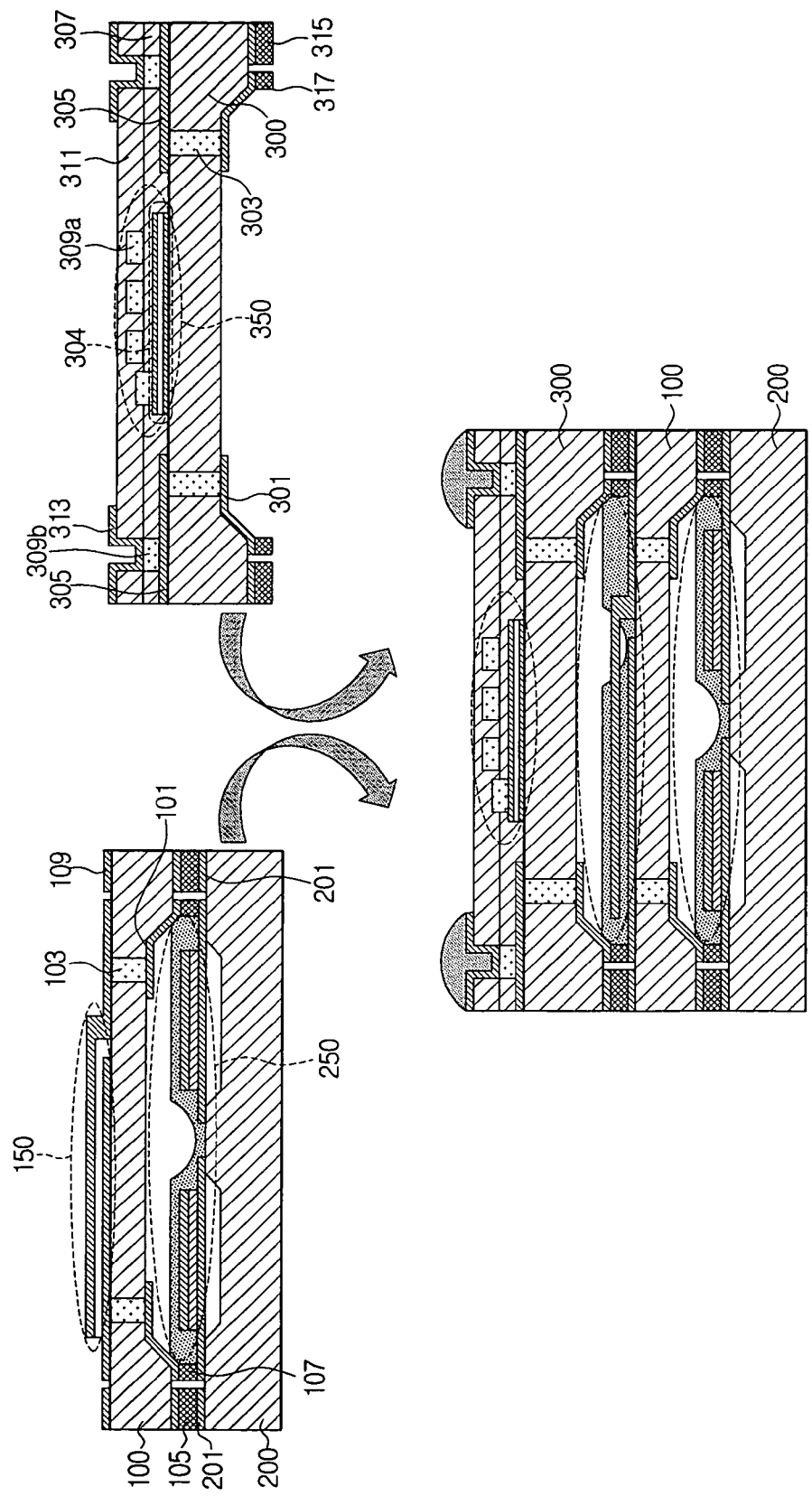
FIG. 3 is a view illustrating a combination of wafers for forming the multi stack packaging chip shown in FIG. 2.

FIG. 3 is a view illustrating a combination of wafers for forming the multi stack packaging chip shown in FIG. 2. In other words, FIG. 3 is a view illustrating a process of combining wafers for forming the multi stack packaging chip shown in FIG. 2.

Referring to FIG. 3, the base wafer 200 on which the first circuit elements 250 are positioned is combined with the first cap wafer 100, and then the second circuit element 150 is formed on the first cap wafer 100.

The third circuit element 350 is formed on the second cap wafer 300 having the cavity, and the solder 319 is formed on the third circuit element 350 so as to electrically connect the multi stack packaging chip to the packaging substrate (not shown).

The first cap wafer 100 is combined with the second cap wafer 300 so that the cavity of the second cap wafer 300 is positioned on the second circuit element 150 of the first cap wafer 100, so as to package the second circuit element 150 positioned on the first cap wafer 100.

Figure 4:
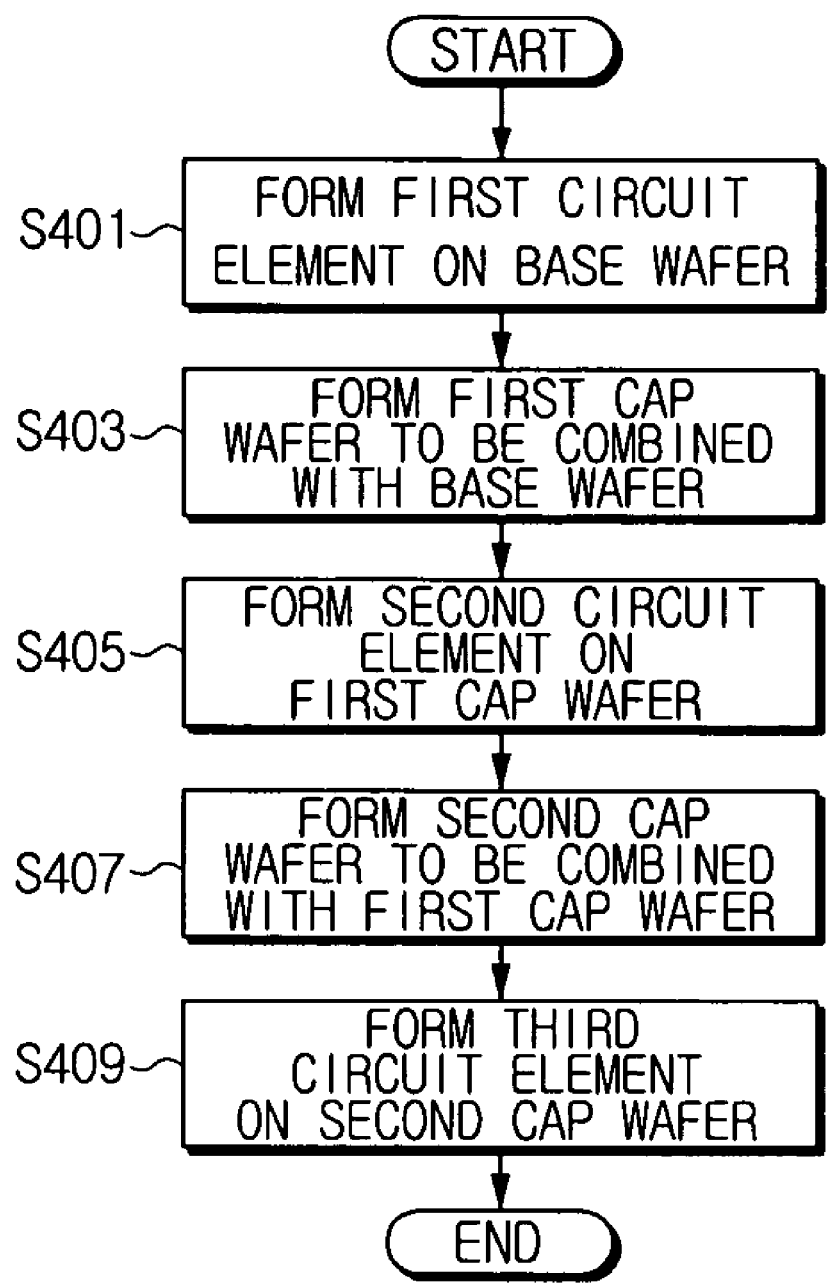
FIG. 4 is a flowchart of a method of manufacturing a multi stack packaging chip according to an exemplary embodiment of the present invention.
Figure 5A:
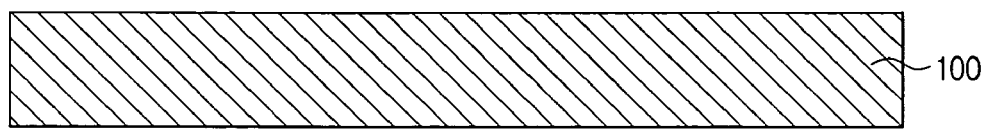
FIGS. 5A through 5U are cross-sectional views illustrating a method of manufacturing the multi stack packaging chip shown in FIG. 4.
Figure 5B:
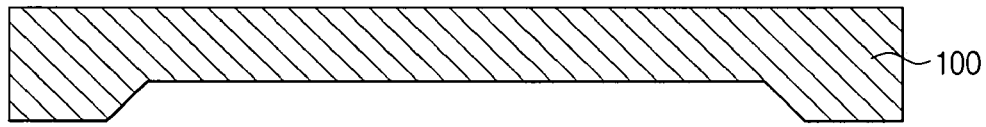

FIG. 4 is a flowchart of a method of manufacturing a multi stack packaging chip according to an exemplary embodiment of the present invention. FIGS. 5A through 5U are cross-sectional views illustrating a method of manufacturing the multi stack packaging chip shown in FIG. 4.

FIGS. 5A through 5F are cross-sectional views illustrating a process of forming the first cap wafer 100 packaging the first circuit elements 250.

Referring to FIG. 4 and FIGS. 5A through 5F, in operation S401, the first circuit elements 250 are formed on the base wafer 200. The first circuit elements 250 to be packaged are formed in the area of the base wafer 200, and the bonding pad 201 is formed on the base wafer 200 to combine the first cap wafer 100 packaging the first circuit elements 250 with the base wafer 200. The area may be predetermined.

In operation S403, the first cap wafer 100 to be combined with the base wafer 200 is formed. As shown in FIGS. 5A and 5B, the cavity is formed in an area of the base wafer 200. The area may be predetermined. The cavity is formed in the first cap wafer 100 so that the cavity of the first cap wafer 100 is positioned on the first circuit elements 250 positioned on the base wafer 200.

Figure 5C:
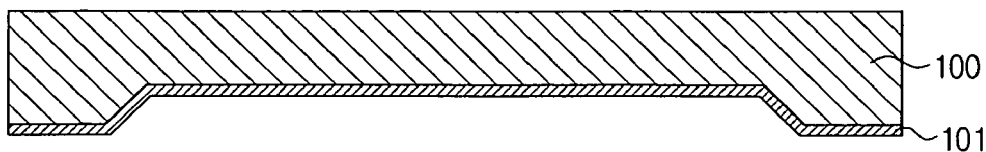
Figure 5D:
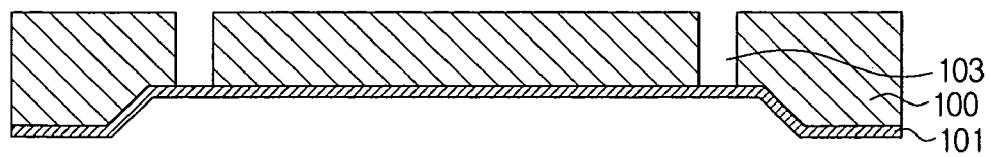
Figure 5E:
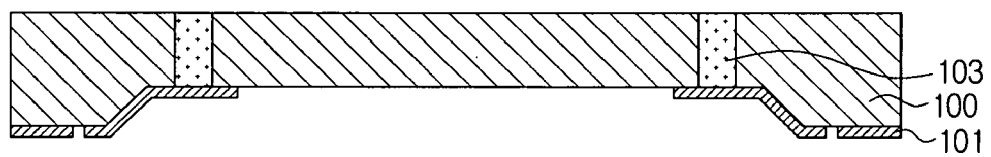

As shown in FIG. 5C, a seed layer is formed underneath the first cap wafer 100. Here, the seed layer is patterned to be formed as the first lower electrode 101. Referring to FIG. 5D, the area of the first cap wafer 100 in which the cavity is formed is etched to expose the seed layer so as to form a viahole. The area may be predetermined. Here, the viahole is formed using reactive ion etching (RIE) or other etching process known in the art. Referring to FIG. 5E, the viahole is peeled by a metal material to be formed as the first through electrode 103. Here, the first through electrode 103 is formed by plating the viahole with the metal material, and the metal material may be Au, Ni, Cu, or other plating material known in the art.

Figure 5F:
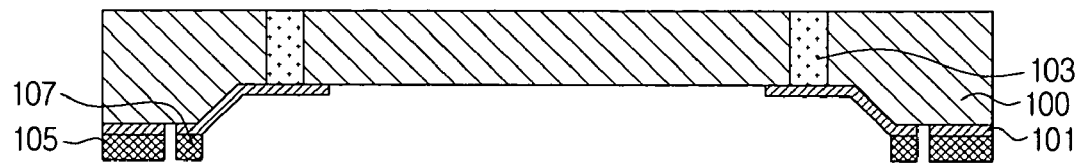

Referring to FIG. 5F, the first contact pad 107 is formed underneath the first lower electrode 101, and the first sealing pad 105 is formed in the area of the surface of the first cap wafer 100 in which the cavity is not formed so as to keep a distance from the first lower electrode. The distance may be predetermined. Here, the first sealing pad 105 is combined with the base wafer 200 so as to electrically connect the first cap wafer 100 to the base wafer 200.

Figure 5G:
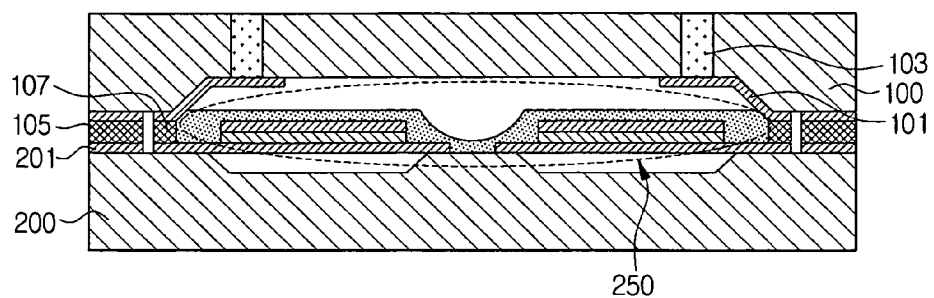
Figure 5H:
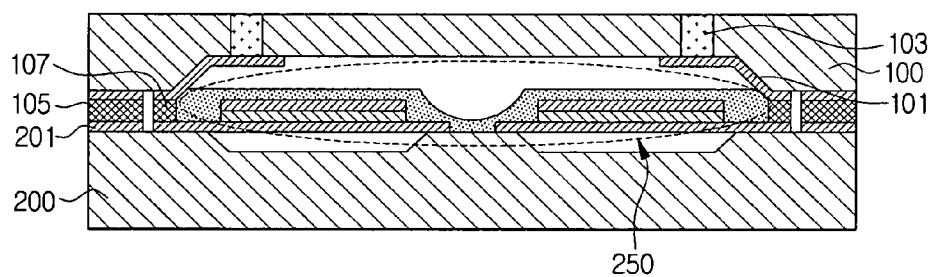
Figure 5I:
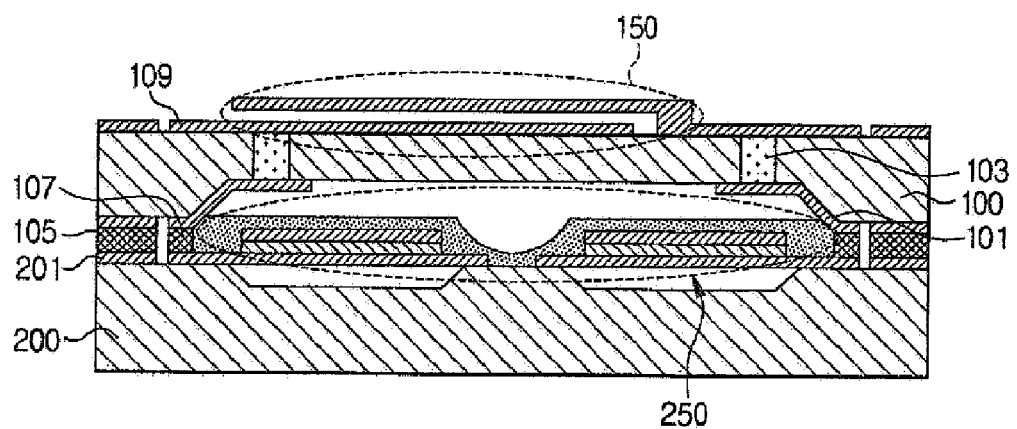

FIGS. 5G through 5I are cross-sectional views illustrating a process of combining the base wafer 200 with the first cap wafer 100 and then forming the second circuit element 150 on the first cap wafer 100.

Referring to FIG. 4 and FIGS. 5G through 5I, in operation S403, the first cap wafer 100 to be combined with the base wafer 200 is formed. Referring to FIG. 5G, the first contact pad 107 of the first cap wafer 100 is combined with the first circuit elements 250, and the first sealing pad 105 of the first cap wafer 100 is combined with the bonding pad 201. In other words, the base wafer 200 is combined with the first cap wafer 100 so that the cavity of the first cap wafer 100 is positioned on the first circuit elements 250. Here, the base wafer 200 and the first cap wafer 100 are combined with each other using eutectic bonding, or other bonding method known in the art.

In operation S405, the second circuit element 150 is formed on the first cap wafer 100. Referring to FIG. 5H, the first cap wafer 100 is etched and planarized using chemical mechanical polishing (CMP) or other similar process known in the art to form and package a circuit element on the first cap wafer 100. As shown in FIG. 5I, the second circuit element 150 is formed on the planarized first cap wafer 100.

FIGS. 5J through 5O are cross-sectional views illustrating a process of forming the second cap wafer 300 packaging the second circuit element 150.

Referring to FIG. 4 and FIGS. 5J through 5O, in operation S407, the second cap wafer 300 to be combined with the first cap wafer 100 is formed. The process of forming the second cap wafer 300 is similar to the process of forming the first cap wafer 100. In other words, the process described with reference to FIGS. 5J through 5O is similar to the process described with reference to FIGS. 5A through 5F.

Figure 5J:
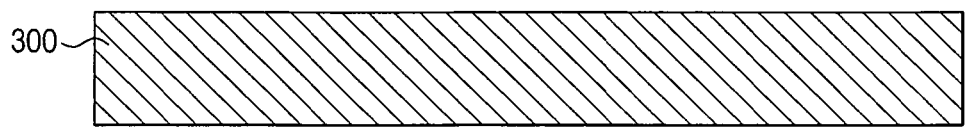
Figure 5K:
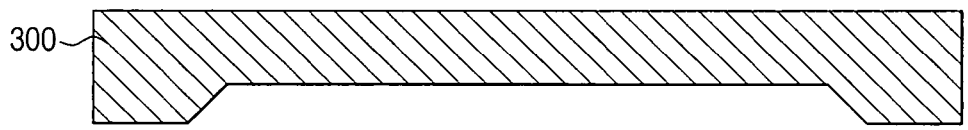
Figure 5L:
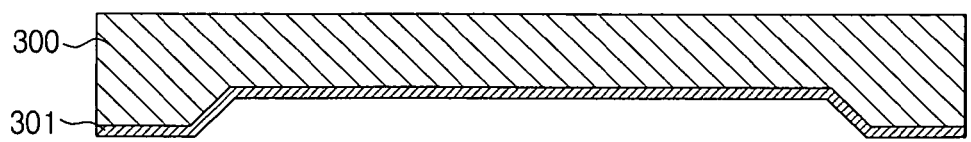
Figure 5M:
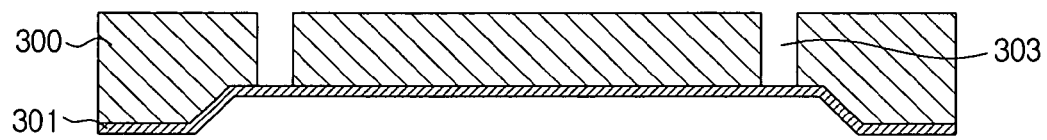
Figure 5N:
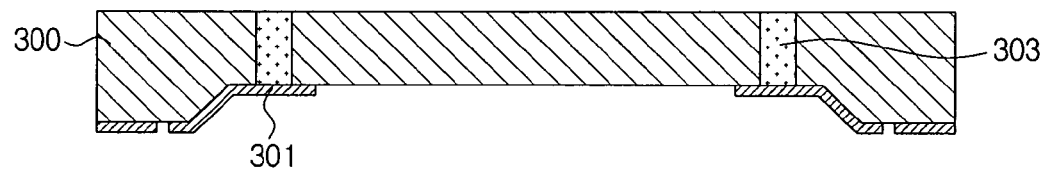
Figure 5O:
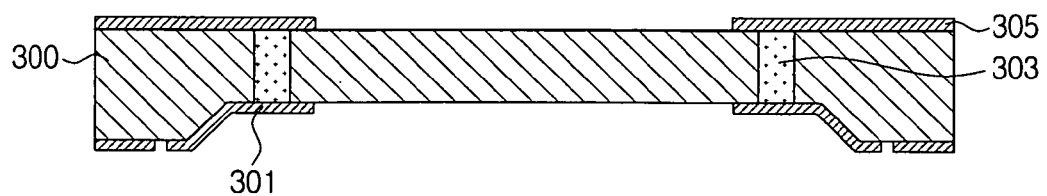

As shown in FIGS. 5J and 5O, a cavity is formed as a space for packaging the second circuit element 250 in the second cap wafer 300, and the seed layer is formed on the surface of the second cap wafer 300 in which the cavity is formed. An area of the cavity is etched to expose the seed layer so as to form a viahole. The area may be predetermined. Then the seed layer is patterned. A portion of the patterned seed layer underneath the viahole is the second lower electrode 301. Also, the viahole is peeled with the metal material to form the second through electrode 303 so as to electrically connect the second circuit element 150 to the second through electrode 303.

Also, the second upper electrode 305 is formed in the area of the upper surface of the second cap wafer 300 so as to connect the second upper electrode 305 and the second through electrode 303 to the second lower electrode 301. Thus, the second circuit element 150 may be electrically connected to the third circuit element 350 formed on the second cap wafer 300 through the second upper electrode 305, the second through electrode 303, and the second lower electrode 301.

FIGS. 5P through 5U are cross-sectional views illustrating a process of forming the third circuit 350 and the solder 319 on the second cap wafer 300.

Figure 5P:
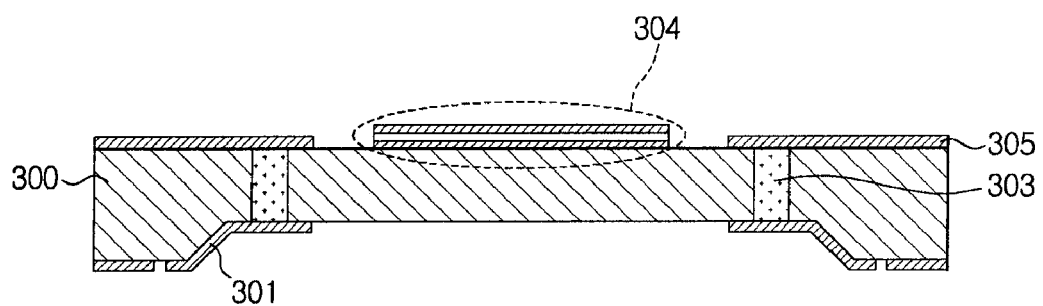
Figure 5Q:
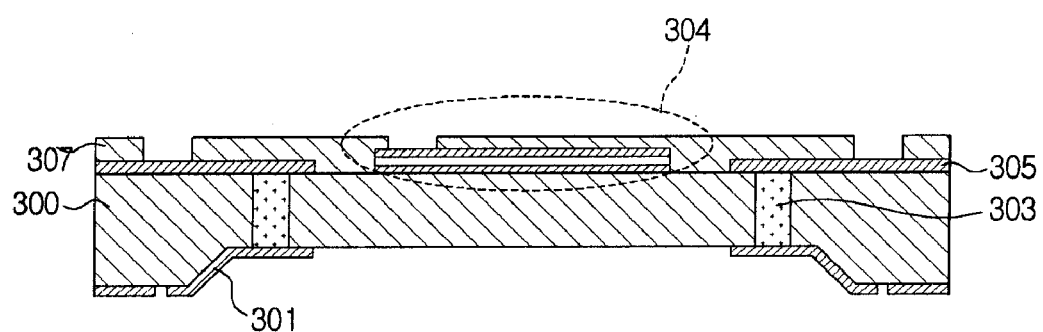
Figure 5R:
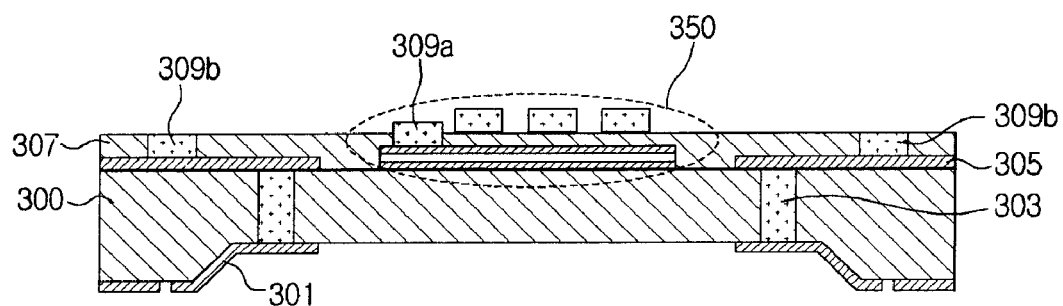
Figure 5S:
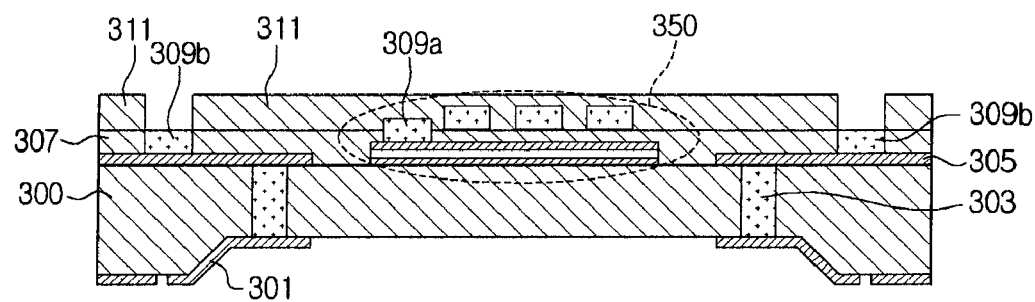
Figure 5T:
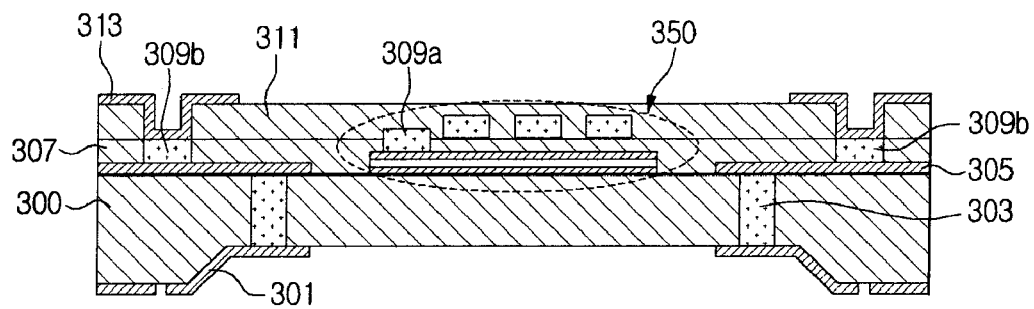
Figure 5U:
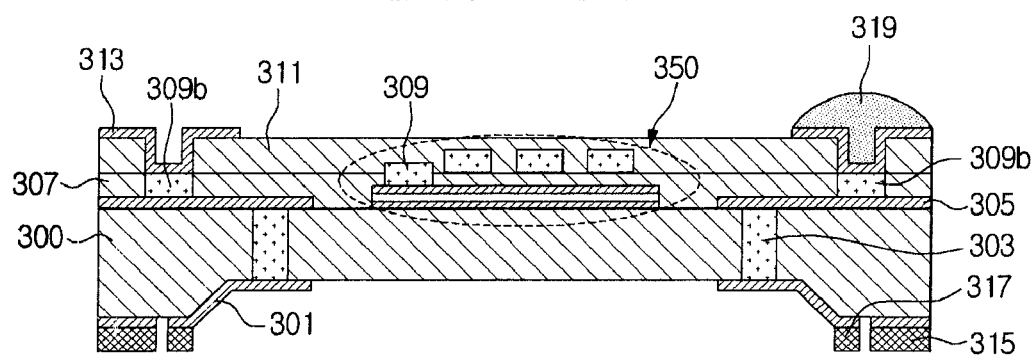

Referring to FIG. 4 and FIGS. 5P through 5U, in operation S409, the third circuit element 350 is formed on the second cap wafer 300. As shown in FIG. 5P, an inductor and a capacitor 304 of the third circuit element 350 are formed in the area of the upper surface of the second cap wafer 300 in which the second upper electrode 305 is not formed.

Referring to FIG. 5Q, the first insulating layer 307 is formed on the second upper electrode 305, and the inductor and the capacitor 304. Here, the first insulating layer 307 may be a benzocyclobutene (BCB) layer or similar layer known in the art. An area of the first insulating layer 307 in which the solder 319 electrically connecting the packaging chip to the packaging substrate is to be formed and an area of the first insulating layer 307 in which a resistor 309a of the third circuit element 350 to be formed on the inductor and the capacitor 304 is to be formed are etched.

Here, the area of the first insulating layer 307 in which the solder 319 is to be formed is etched in a predetermined pattern so as to expose the second upper electrode 305. The pattern may be predetermined. The area of the first insulating layer 307 in which the resistor 309a is to be formed is etched so as to expose the inductor and the capacitor 304. Thus, the first insulating layer 307 is etched so as to connect the solder 319 to the second upper electrode 305 and to connect the resistor 309a to the inductor and the capacitor 304.

Referring to FIG. 5R, the metal material is formed in the area in which the first insulating layer 307 has been etched to form a connecting layer 309b connecting the second upper electrode 305 and the solder 319, and the resistor 309a connected to the inductor and the capacitor 304. As shown in FIG. 5S, the second insulating layer 311 is formed on the first insulating layer 307, the connecting layer 309b, and the resistor 309a and then etched so as to expose the connecting layer 309b.

As shown in FIG. 5T, a barrier layer 313 is formed on the connecting layer 309b to prevent the metal material from diffusing to the second insulating layer 311 during forming of the solder 319 on the exposed connecting layer 309b and then etched so as not to expose the connecting layer 309b. Referring to FIG. 5U, the metal material is formed on the etched barrier layer 313 to form the solder 319.

As the combinations of wafers described with reference to FIG. 3, the second circuit element 150 formed on the first cap wafer 100 combined with the base wafer 200 through the process described with reference to FIGS. 5A through 5I is combined with the second cap wafer 300 which packages the second circuit element 150 and on which the third circuit element 350 is formed through the process described with reference to FIGS. 5J and 5U, so as to generate a multi stack packaging chip.

As described above, according to the present invention, a circuit element can be formed and packaged on a cap wafer of a flip-chip packaged chip so as to form a plurality of packaging chips having stack structures. Thus, a packaging chip including a plurality of circuit elements can be generated to generate a compact, multifunctional chip.

The foregoing embodiment and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A multi stack packaging chip comprising:
   a flip-chip packaged chip in which at least one first circuit element is packaged using a first cap wafer;
   at least one second circuit element formed on the first cap wafer;
   a second cap wafer comprising an area comprising a cavity and combined with the first cap wafer so that a position of the cavity corresponds to an area in which the second circuit element is positioned, wherein the second cap wafer comprises a second through electrode formed in the area in which the cavity is formed so as to electrically couple the second cap wafer to the second circuit element;
   at least one third circuit element formed on the second cap wafer; and
   a solder formed on an area of the second cap wafer so as to electrically couple the second cap wafer to an external packaging substrate.

2. The multi stack packaging chip of claim 1, further comprising an insulating layer which is formed on the third circuit element so as to insulate the third circuit element from the external packaging substrate.

3. The multi stack packaging chip of claim 2,
   wherein the insulating layer comprises first and second insulating layers, the second insulating layer being formed on the first insulating layer,
   wherein the first insulating layer comprises at least one first etched area in which a connecting layer is formed to connect the third circuit element and the solder, and at least one second etched area through which the third circuit element is exposed, and
   wherein the second insulating layer comprises at least one third etched area in which the solder is positioned.

4. The multi stack packaging chip of claim 1, wherein the flip-chip packaged chip comprises:
   a base wafer;
   the at least one first circuit element formed on the base wafer;
   the first cap wafer comprising an area comprising a cavity and combined with the base wafer so that a position of the cavity corresponds to a position of the first circuit element; and
   a first through electrode formed in an area of the first cap wafer in which the cavity is formed, so as to electrically couple the first cap wafer to the first circuit element.

5. The multi stack packaging chip of claim 1, wherein the at least one first circuit element is two filters, the second circuit element is a switch, and the third circuit element is a phase shifter isolating the two filters from each other, wherein the first, second, and third circuit elements operate as duplexers.

6. The multi stack packaging chip of claim 1, wherein the third circuit element does not need to be sealed and comprises at least one of an inductor, a capacitor, a transistor, and a resistor.

7. The multi stack packaging chip of claim 4, wherein the first and second circuit elements are electrically connected to each other using the first through electrode.

8. The multi stack packaging chip of claim 1, wherein the second and third circuit elements are electrically connected to each other using the second through electrode.

9. A method of manufacturing a multi stack packaging chip, the method comprising:
    forming at least one second circuit element on a first cap wafer of a flip-chip packaged chip in which at least one first circuit element is packaged using the first cap wafer;
    forming a second cap wafer comprising an area comprising a cavity and at least one third circuit element formed on an opposite surface to a surface on which the cavity is formed, wherein the forming of the second cap wafer comprises forming a second through electrode in the area of the second cap wafer in which the cavity is formed so as to electrically couple the second cap wafer to the second circuit element;
    forming a solder on an area of the second cap wafer so as to electrically couple the second cap wafer to an external packaging substrate; and
    combining the second cap wafer with the first cap wafer so that a position of the second circuit element of the first cap wafer corresponds to a position of the cavity of the second cap wafer.

10. The method of claim 9, further comprising forming an insulating layer on the third circuit element so as to insulate the third circuit element from the external packaging substrate.

11. The method of claim 9, wherein the forming of the flip-chip packaged chip comprises:
    forming the at least one first circuit element on a base wafer;
    forming the first cap wafer comprising an area comprising a cavity, wherein the first cap wafer is combined with the base wafer so that a position of the cavity corresponds to a position of the first circuit element; and
    forming a first through electrode in the area of the first cap wafer in which the cavity is formed, so as to electrically couple the first cap wafer to the first circuit element.

12. The method of claim 9, wherein the third circuit element does not need to be sealed and comprises at least one of an inductor, a capacitor, a transistor, and a resistor.

13. The multi stack packaging chip of claim 7, wherein the second and third circuit elements are electrically connected to each other using the second through electrode.

14. The method of claim 11, wherein the first and second circuit elements are electrically connected to each other using the first through electrode.

15. The method of claim 14, wherein the second and third circuit elements are electrically connected to each other using the second through electrode.

16. The method of claim 9, wherein the second and third circuit elements are electrically connected to each other using the second through electrode.

* * * * *